United States Patent [19]

Eldridge et al.

[11] Patent Number: 6,050,829
[45] Date of Patent: Apr. 18, 2000

[54] MAKING DISCRETE POWER CONNECTIONS TO A SPACE TRANSFORMER OF A PROBE CARD ASSEMBLY

[75] Inventors: Benjamin N. Eldridge, Danville; Gary W. Grube, Pleasanton; Igor Y. Khandros, Orinda; Gaetan L. Mathieu, Livermore, all of Calif.

[73] Assignee: FormFactor, Inc., Livermore, Calif.

[21] Appl. No.: 08/920,255

[22] Filed: Aug. 28, 1997

Related U.S. Application Data

[63] Continuation-in-part of application No. 08/554,902, filed as application No. PCT/US95/14844, Nov. 13, 1995
[60] Provisional application No. 60/024,741, Aug. 28, 1996.

[51] Int. Cl.[7] .................................................. G01R 31/02
[52] U.S. Cl. .............................................. 439/67; 324/761
[58] Field of Search ....................... 439/66, 67; 324/754, 324/761

[56] References Cited

U.S. PATENT DOCUMENTS 4,084,869  4/1978  Yen .......................................... 439/651
5,157,325  10/1992  Murphy .................................... 324/761
5,383,787  1/1995  Switky .................................... 439/71
5,475,317  12/1995  Smith ...................................... 324/754

*Primary Examiner*—Neil Abrams
*Attorney, Agent, or Firm*—David Larwood; Gerald E. Linden

[57] ABSTRACT

By segregating at least a substantial portion of the power connections to the space transformer component (506, 700, 800) from the signal connections thereto, constraints on the interposer component (504) may be relaxed. This is particularly advantageous in the context of probing one or more high power semiconductor components. The technique of the present invention provides for a plurality of signals (including power and ground) to be inserted into an electronic component such as a space transformer both from a one main surface thereof and an edge (periphery) thereof to an opposite main surface thereof. The space transformer includes pads (522, 706, 810) for engaging, by means of spring elements (524), component (508) to be tested and includes exposed edge pads (750, 804, 854) for engagement by a flexible cable (752) for transmission of power and ground signals to the space transformer. The system also includes an interposer (504) having resilient contacts (514, 516) for electrically interconnecting a probe card (502) to the space transformer (506).

3 Claims, 5 Drawing Sheets

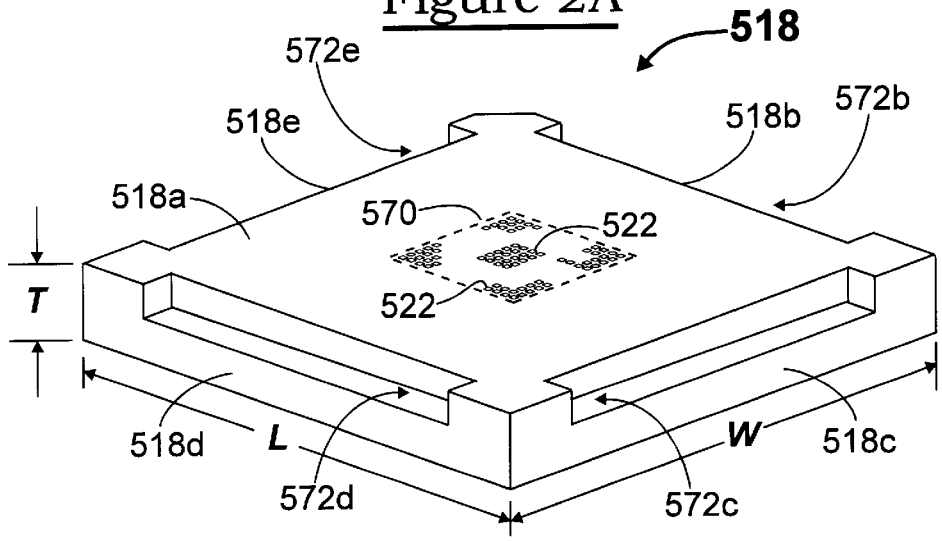
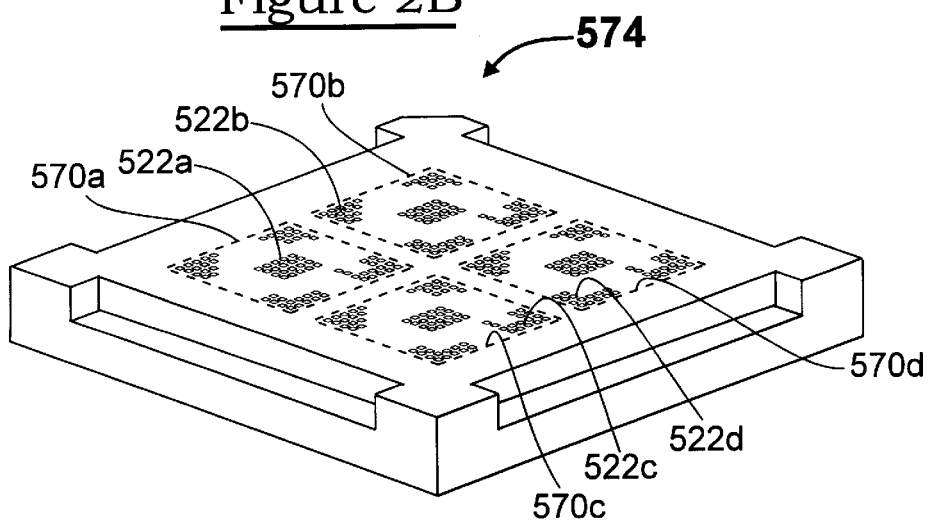

MAKING DISCRETE POWER CONNECTIONS TO A SPACE TRANSFORMER OF A PROBE CARD ASSEMBLY

CROSS-REFERENCE TO RELATED APPLICATIONS

This patent application is a continuation-in-part of commonly-owned, copending U.S. patent application Ser. No. 08/554,902 filed Nov. 9, 1995 and of its counterpart PCT Patent Application No. US95/14844 filed Nov. 13, 1995, published as WO 96/15458 May 23, 1996 both of which are incorporated by reference herein.

This patent application is a continuation of commonly-owned, copending U.S. Provisional Patent Application Ser. No. 60/024,741 filed Aug. 28, 1996, which is incorporated by reference herein.

TECHNICAL FIELD OF THE INVENTION

The invention relates to making temporary, pressure connections between electronic components and, more particularly, to techniques for performing test and burn-in procedures on semiconductor devices prior to their packaging, preferably prior to the individual semiconductor devices being singulated from a semiconductor wafer.

BACKGROUND OF THE INVENTION

Individual semiconductor (integrated circuit) devices (dies) are typically produced by creating several identical devices on a semiconductor wafer, using know techniques of photolithography, deposition, and the like. Generally, these processes are intended to create a plurality of fully-functional integrated circuit devices, prior to singulating (severing) the individual dies from the semiconductor wafer. In practice, however, certain physical defects in the wafer itself and certain defects in the processing of the wafer inevitably lead to some of the dies being "good" (fully-functional) and some of the dies being "bad" (non-functional). It is generally desirable to be able to identify which of the plurality of dies on a wafer are good dies prior to their packaging, and preferably prior to their being singulated from the wafer. To this end, a wafer "tester" or "prober" may advantageously be employed to make a plurality of discrete pressure connections to a like plurality of discrete connection pads (bond pads) on the dies. In this manner, the semiconductor dies can be tested and exercised, prior to singulating the dies from the wafer. A conventional component of a wafer tester is a "probe card" to which a plurality of probe elements are connected—tips of the probe elements effecting the pressure connections to the respective bond pads of the semiconductor dies.

Prior art probe card assemblies include a plurality of tungsten needles extending as cantilevers from a surface of a probe card. The tungsten needles may be mounted in any suitable manner to the probe card, such as by the intermediary of an epoxy ring, as discussed hereinabove. Generally, in any case, the needles are wired to terminals of the probe card through the intermediary of a separate and distinct wire connecting the needles to the terminals of the probe card.

Probe cards are typically formed as circular rings, with hundreds of probe elements (needles) extending from an inner periphery of the ring (and wired to terminals of the probe card). Circuit modules, and conductive traces (lines) of preferably equal length, are associated with each of the probe elements. This ring-shape layout makes it difficult, and in some cases impossible, to probe a plurality of unsingulated semiconductor dies (multiple sites) on a wafer, especially when the bond pads of each semiconductor die are arranged in other than two linear arrays along two opposite edges of the semiconductor die.

The aforementioned commonly-owned, copending PCT Patent Application No. US95/14844, a priority application to the present specification, published as WO 96/15458 May 23, 1996, discloses a probe card assembly which includes a probe card, a space transformer having resilient contact structures (probe elements) mounted directly to (i.e., without the need for additional connecting wires or the like) and extending from terminals on a surface thereof, and an interposer disposed between the space transformer and the probe card. The space transformer and interposer are "stacked up" so that the orientation of the space transformer, hence the orientation of the tips of the probe elements, can be adjusted without changing the orientation of the probe card. Suitable mechanisms for adjusting the orientation of the space transformer, and for determining what adjustments to make, are disclosed. The interposer has resilient contact structures extending from both the top and bottom surfaces thereof, and ensures that electrical connections are maintained between the space transformer and the probe card throughout the space transformer's range of adjustment, by virtue of the interposer's inherent compliance. Multiple die sites on a semiconductor wafer are readily probed using the disclosed techniques, and the probe elements can be arranged to optimize probing of an entire wafer. Composite interconnection elements having a relatively soft core overcoated by a relatively hard shell, as the resilient contact structures are described.

In the probe card assembly of US95/14844, the space transformer component conveys both signals and power to the semiconductor device(s) being probed. For probing (e.g., testing) certain high-power semiconductor devices, a relatively large amount of power required to drive the devices. In such a probe card assembly, both power and signals are conveyed to the space transformer component by an interposer component.

SUMMARY OF THE INVENTION

It is an object of the present invention to provide a technique for probing semiconductor devices, particularly while they are resident on a semiconductor wafer.

It is another object of the invention to provide a technique for conveying power directly to the space transformer component of a probe card assembly, rather than via the intermediary of the interposer component.

According to the invention, a probe card assembly includes a probe card (electronic component) having a top surface, a bottom surface and a plurality of terminals on the top surface thereof; an interposer (electronic component) having a top surface, a bottom surface, a first plurality of resilient contact structures extending from terminals on the bottom surface thereof and a second plurality of contact structures extending from terminals on the top surface thereof; and a space transformer (electronic component) having a top surface, a bottom surface, a side edge, a first plurality of terminals (contact pads) on the top surface of the space transformer, a second plurality of terminals on the bottom surface of the space transformer connected within the space transformer to a first portion of the first plurality of terminals, a third plurality of terminals on the side edge of the space transformer connected within the space transformer to a second portion of the first plurality of terminals, and a third plurality of resilient contact structures (probe elements) extending from the first plurality of terminals on the top surface of the space transformer.

The interposer is disposed between the top surface of the probe card and the bottom surface of the space transformer, and allows the orientation (planarity) of the space transformer to be adjusted without altering the orientation of the probe card. A suitable mechanism for effecting this adjustment of space transformer orientation, and a technique for determining the correct orientation of the space transformer are disclosed herein. In this manner, the tips (distal ends) of the probe elements can be adjusted to ensure reliable pressure contact between the tips of the probe elements and corresponding bond pads (terminals) of a semiconductor device being probed.

The interposer conveys signals from the probe card to the second plurality of terminals on the bottom surface of the space transformer, whereupon they are conveyed to a first portion of the plurality of contact structures (probe elements) extending from the first plurality of terminals on the top surface of the space transformer.

A flexible circuit board having a plurality of contact areas conveys power and ground to the third plurality of terminals on the side edge of the space transformer, whereupon they are conveyed to a second portion of the plurality of contact structures (probe elements) extending from the first plurality of terminals on the top surface of the space transformer.

Generally, the space transformer component permits a plurality of resilient contact structures extending from its top surface to make contact with terminals of an electronic component (i.e., bond pads on semiconductor devices) at a relatively fine pitch (spacing), while connections to the space transformer (i.e., to the bond pads or, alternatively, resilient contact structures) on its bottom surface are effected at a relatively coarser pitch.

Other objects, features and advantages of the invention will become apparent in light of the following description thereof.

BRIEF DESCRIPTION OF THE DRAWINGS

Reference will be made in detail to preferred embodiments of the invention, examples of which are illustrated in the accompanying drawings. Although the invention will be described in the context of these preferred embodiments, it should be understood that it is not intended to limit the spirit and scope of the invention to these particular embodiments.

FIG. 2A is a perspective view of a space transformer component suited for use in the probe card assembly of FIG. 2, according to the invention of U.S. Ser. No. 08/554,902.

FIG. 2B is a perspective view of another space transformer component suited for use in the probe card assembly of FIG. 2, according to the invention of U.S. Ser. No. 08/554,902.

DETAILED DESCRIPTION OF THE INVENTION

"Generic" Space Transformer

Figure 1:
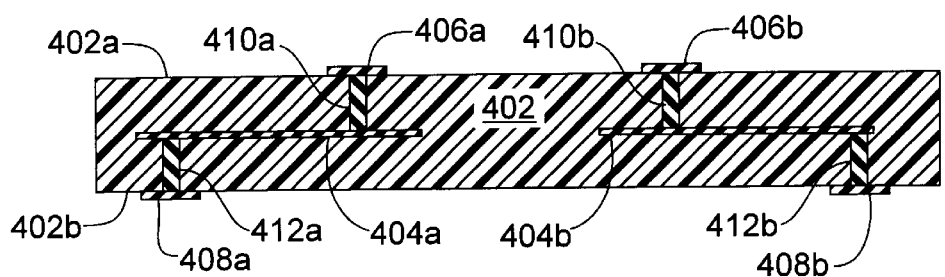
FIG. 1 is a cross-sectional view of an embodiment of a generic space transformer, according to the invention.
Figure 4:
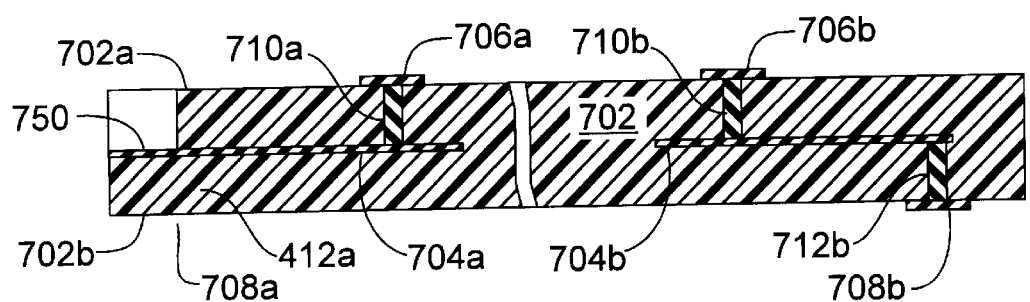
FIG. 4 is a cross-sectional view of a space transformer component having discrete power connections which are separate from the signal connections, according to the present invention.

FIG. 1 (comparable to FIG. 4 of U.S. Ser. No. 08/554,902) illustrates an exemplary design of a space transformer component 400, such as would be used in a probe card assembly.

The space transformer substrate 402 has a top (as viewed) surface 402a and a bottom (as viewed) surface 402b, and is preferably formed as a multi-layer component having alternating layers of insulating material (e.g., ceramic) and conductive material. In this example, one wiring layer is shown as including two (of many) conductive traces 404a and 404b.

A plurality (two of many shown) of terminals 406a and 406b are disposed on the top surface 402a of the space transformer substrate 402 at a relatively fine pitch (relatively close to one another). A plurality (two of many shown) of terminals 408a and 408b are disposed on the bottom surface 402b of the space transformer substrate 402 at a relatively coarse pitch (relative to the terminals 406a and 406b, further apart from one another). For example, the bottom terminals 408a and 408b may be disposed at a 50–100 mil pitch (comparable to printed circuit board pitch constraints), and the top terminals 406a and 406b may be disposed as a 5–10 mil pitch (comparable to the center-to-center spacing of semiconductor die bond pads), resulting in a 10:1 pitch-transformation. The top terminals 406a and 406b are connected to the corresponding bottom terminals 408a and 408b, respectively, by associated conductors 410a/412a and 410b/412b, respectively, connecting the terminals to the conductive traces 404a and 404b, respectively. This is all generally well known, in the context of multi-layer land grid array (LGA) support substrates, and the like.

Probe Card Assembly

Figure 2:
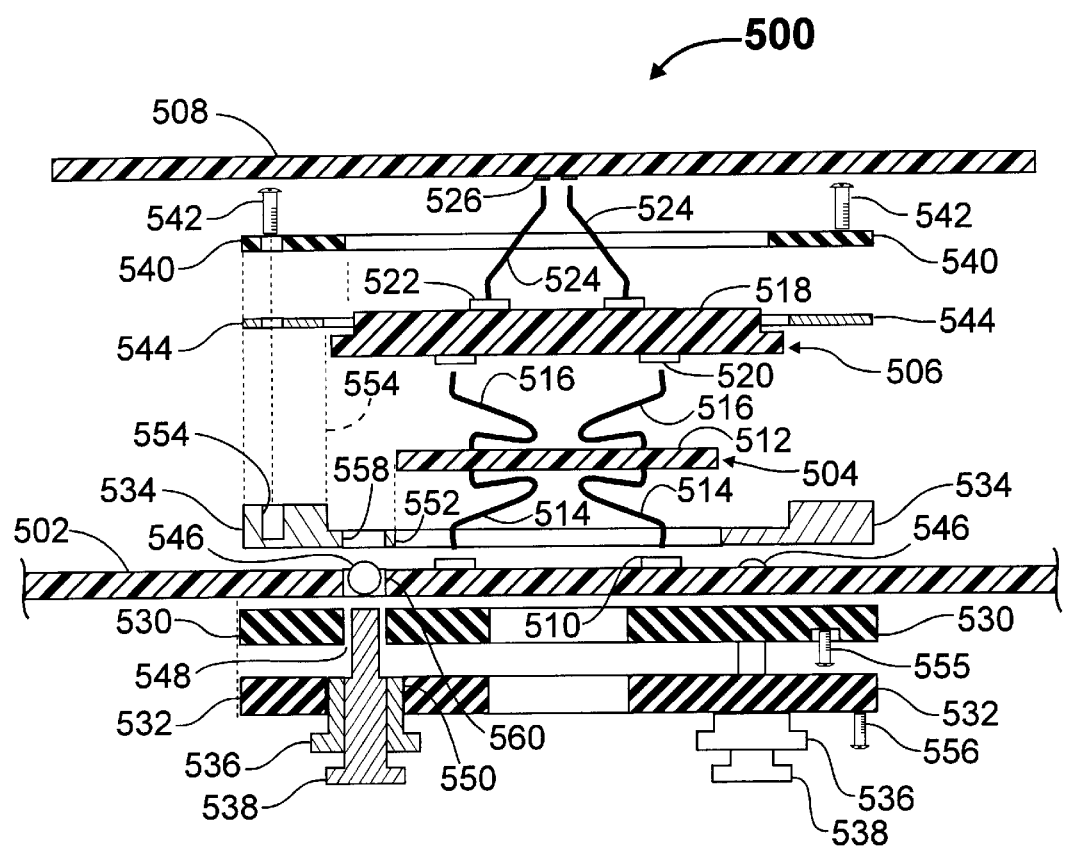
FIG. 2 is an exploded view, partially in cross-section, of a probe card assembly, according to the invention of U.S. Ser. No. 08/554,902.

FIG. 2 (comparable to FIG. 5 of U.S. Ser. No. 08/554,902) illustrates an embodiment of a probe card assembly 500 which includes as its major functional components a probe card 502, an interposer 504 and a space transformer 506, and which is suitable in use for making temporary interconnections to a semiconductor wafer 508. In this exploded, cross-sectional view, certain elements of certain components are shown exaggerated, for illustrative clarity. However, the vertical (as shown) alignment of the various components is properly indicated by the dashed lines in the figure. It should be noted that the interconnection elements (514, 516, 524, discussed in greater detail hereinbelow) are shown in full, rather than in section.

The probe card 502 is generally a conventional circuit board substrate having a plurality (two of many shown) of contact areas (terminals) 510 disposed on the top (as viewed) surface thereof. Additional components (not shown) may be mounted to the probe card, such as active and passive electronic components, connectors, and the like. The terminals 510 on the circuit board may typically be arranged at a 100 mil pitch (pitch is defined hereinabove). The probe card 502 is suitably round, having a diameter on the order of 12 inches.

The interposer 504 includes a substrate 512 (compare the substrate 302). In the manner described hereinabove, a plurality (two of many shown) of resilient interconnection elements 514 are mounted (by their proximal ends) to and extend downward (as viewed) from the bottom (as viewed) surface of the substrate 512, and a corresponding plurality (two of many shown) of resilient interconnection elements 516 are mounted (by their proximal ends) to and extend upward (as viewed) from the top (as viewed) surface of the substrate 512. Any of the aforementioned spring shapes are suitable for the resilient interconnection elements 514 and 516, which are preferably the composite interconnection elements of the present invention. As a general proposition, the tips (distal ends) of both the lower plurality 514 and of the upper plurality 516 of interconnection elements 514 and 516 are at a pitch which matches that of the terminals 510 of the probe card 502, for example 100 mils.

The interconnection elements 514 and 516 are illustrated with exaggerated scale, for illustrative clarity. Typically, the interconnection elements 514 and 516 would extend to an overall height of 20–100 mils from respective bottom and top surfaces of the interposer substrate 512. Generally, the height of the interconnection elements is dictated by the amount of compliance desired.

The space transformer 506 includes a suitable circuitized substrate 518 (compare 402, described hereinabove), such as a multi-layer ceramic substrate having a plurality (two of many shown) of terminals (contact areas, pads) 520 disposed on the lower (as viewed) surface thereof and a plurality (two of many shown) of terminals (contact areas, pads) 522 disposed on the upper (as viewed) surface thereof. In this example, the lower plurality of contact pads 520 is disposed at the pitch of the tips of the interconnection elements 516 (e.g., 100 mils), and the upper plurality of contact pads 522 is disposed at a finer (closer) pitch (e.g., 50 mils). These resilient interconnection 514 and 516 elements are preferably, but not necessarily, the composite interconnection elements of U.S. Ser. No. 08/554,902 (compare the discussion of FIG. 2A of that specification.

A plurality (two of many shown) of resilient interconnection elements 524 ("probes", "probe elements") are mounted (by their proximal ends) directly (i.e., without the intermediary of additional materials such as wires connecting the probe elements to the terminals, or brazing or soldering the probe elements to the terminals) to the terminals (contact pads) 522 and extend upward (as viewed) from the top (as viewed) surface of the space transformer substrate 518. As illustrated, these resilient interconnection elements 524 are suitably arranged so that their tips (distal ends) are spaced at an even finer pitch (e.g., 10 mils) than their proximal ends, thereby augmenting the pitch reduction of the space transformer 506. These resilient contact structures (interconnection elements) 524 are preferably, but not necessarily, the composite interconnection elements of the present invention.

It is within the scope of the invention that the probe elements (524) can be fabricated on a sacrificial substrate and subsequently individually mounted or gang-transferred to the terminals (522) of the space transformer component (506).

As is known, a semiconductor wafer 508 includes a plurality of die sites (not shown) formed by photolithography, deposition, diffusion, and the like, on its front (lower, as viewed) surface. Typically, these die sites are fabricated to be identical to one another. However, as is known, flaws in either the wafer itself or in any of the processes to which the wafer is subjected to form the die sites, can result in certain die sites being non-functional, according to well established test criteria. Often, due to the difficulties attendant probing die sites prior to singulating semiconductor dies from a semiconductor wafer, testing is performed after singulating and packaging the semiconductor dies. When a flaw is discovered after packaging the semiconductor die, the net loss is exacerbated by the costs attendant to packaging the die. Semiconductor wafers typically have a diameter of at least 6 inches, including at least 8 inches.

Each die site typically has a number of contact areas (e.g., bond pads), which may be disposed at any location and in any pattern on the surface of the die site. Two (of many) bond pads 526 of a one of the die sites are illustrated in the figure.

A limited number of techniques are known for testing the die sites, prior to singulating the die sites into individual semiconductor dies. A representative prior art technique involves fabricating a probe card insert having a plurality of tungsten "needles" embedded in and extending from a ceramic substrate, each needle making a temporary connection to a given one of the bond pads. Such probe card inserts are expensive and somewhat complex to manufacture, resulting in their relatively high cost and in a significant lead time to obtain. Given the wide variety of bond pad arrangements that are possible in semiconductor dies, each unique arrangement requires a distinct probe card insert.

The rapidity with which unique semiconductor dies are manufactured highlights the urgent need for probe card inserts that are simple and inexpensive to manufacture, with a short turnaround time. The use of an interposer (504), and a space transformer (506) as a probe card insert, squarely addresses this compelling need.

In use, the interposer 504 is disposed on the top (as viewed) surface of the probe card 502, and the space transformer 506 is stacked atop (as viewed) the interposer 504 so that the interconnection elements 514 make a reliable pressure contact with the contact terminals 510 of the probe card 502, and so that the interconnection elements 516 make a reliable pressure contact with the contact pads 520 of the space transformer 506. Any suitable mechanism for stacking these components and for ensuring such reliable pressure contacts may be employed, a suitable one of which is described hereinbelow.

The probe card assembly 500 includes the following major components for stacking the interposer 506 and the space transformer 506 onto the probe card 502:

- a rear mounting plate 530 made of a rigid material such as stainless steel,
- an actuator mounting plate 532 made of a rigid material such as stainless steel,
- a front mounting plate 534 made of a rigid material such as stainless steel,
- a plurality (two of many shown, three is preferred) of differential screws including an outer differential screw element 536 and an inner differential screw element 538,
- a mounting ring 540 which is preferably made of a springy material such as phosphor bronze and which has a pattern of springy tabs (not shown) extending therefrom, a plurality (two of many shown) of screws 542 for holding the mounting ring 538 to the front mounting plate 534 with the space transformer 506 captured therebetween, optionally, a spacer ring 544 disposed between the mounting ring 540 and the space transformer 506 to accommodate manufacturing tolerances, and a plurality (two of many shown) of pivot spheres 546 disposed atop (as viewed) the differential screws (e.g., atop the inner differential screw element 538).

The rear mounting plate 530 is a metal plate or ring (shown as a ring) disposed on the bottom (as shown) surface of the probe card 502. A plurality (one of many shown) of holes 548 extend through the rear mounting plate.

The actuator mounting plate 532 is a metal plate or ring (shown as a ring) disposed on the bottom (as shown) surface of the rear mounting plate 530. A plurality (one of many shown) of holes 550 extend through the actuator mounting plate. In use, the actuator mounting plate 532 is affixed to the rear mounting plate 530 in any suitable manner, such as with screws (omitted from the figure for illustrative clarity).

The front mounting plate 534 is a rigid, preferably metal ring. In use, the front mounting plate 534 is affixed to the rear mounting plate 530 in any suitable manner, such as with screws (omitted from the figure for illustrative clarity) extending through corresponding holes (omitted from the figure for illustrative clarity) through the probe card 502, thereby capturing the probe card 502 securely between the front mounting plate 534 and rear mounting plate 530.

The front mounting plate 534 has a flat bottom (as viewed) surface disposed against the top (as viewed) surface of the probe card 502. The front mounting plate 534 has a large central opening therethrough, defined by an inner edge 552 the thereof, which is sized to permit the plurality of contact terminals 510 of the probe card 502 to reside within the central opening of the front mounting plate 534, as shown.

As mentioned, the front mounting plate 534 is a ring-like structure having a flat bottom (as viewed) surface. The top (as viewed) surface of the front mounting plate 534 is stepped, the front mounting plate being thicker (vertical extent, as viewed) in an outer region thereof than in an inner region thereof. The step, or shoulder is located at the position of the dashed line (labelled 554), and is sized to permit the space transformer 506 to clear the outer region of the front mounting plate and rest upon the inner region of the front mounting plate 534 (although, as will be seen, the space transformer actually rests upon the pivot spheres 546).

A plurality (one of many shown) of holes 554 extend into the outer region of the front mounting plate 534 from the top (as viewed) surface thereof at least partially through the front mounting plate 534 (these holes are shown extending only partially through the front mounting plate 534 in the figure) which, as will be seen, receive the ends of a corresponding plurality of the screws 542. To this end, the holes 554 are threaded holes. This permits the space transformer 506 to be secured to the front mounting plate by the mounting ring 540, hence urged against the probe card 502.

A plurality (one of many shown) of holes 558 extend completely through the thinner, inner region of the front mounting plate 534, and are aligned with a plurality (one of many shown) of corresponding holes 560 extending through the probe card 502 which, in turn, are aligned with the holes 548 in the rear mounting plate and the holes 550 in the actuator mounting plate 538.

The pivot spheres 546 are loosely disposed within the aligned holes 558 and 560, at the top (as viewed) end of the inner differential screw elements 538. The outer differential screw elements 536 thread into the (threaded) holes 550 of the actuator mounting plate 532, and the inner differential screw elements 538 thread into a threaded bore of the outer differential screw elements 536. In this manner, very fine adjustments can be made in the positions of the individual pivot spheres 546. For example, the outer differential screw elements 536 have an external thread of 72 threads-per-inch, and the inner differential screw elements 538 have an external thread of 80 threads-per inch. By advancing an outer differential screw element 536 one turn into the actuator mounting plate 532 and by holding the corresponding inner differential screw element 538 stationary (with respect to the actuator mounting plate 532), the net change in the position of the corresponding pivot sphere 546 will be 'plus' $\frac{1}{72}$ (0.0139) 'minus' $\frac{1}{80}$ (0.0125) inches, or 0.0014 inches. This permits facile and precise adjustment of the planarity of the space transformer 506 vis-a-vis the probe card 502. Hence, the positions of the tips (top ends, as viewed) of the probes (interconnection elements) 524 can be changed, without changing the orientation of the probe card 502. The importance of this feature, a technique for performing alignment of the tips of the probes, and alternate mechanisms (means) for adjusting the planarity of the space transformer are discussed in greater detail hereinbelow, with respect to FIG. 4. Evidently, the interposer 504 ensures that electrical connections are maintained between the space transformer 506 and the probe card 502 throughout the space transformer's range of adjustment, by virtue of the resilient or compliant contact structures disposed on the two surfaces of the interposer.

The probe card assembly 500 is simply assembled by placing the interposer 504 within the opening 552 of the front mounting plate 534 so that the tips of the interconnection elements 514 contact the contact terminals 510 of the probe card 502, placing the space transformer 506 on top of the interposer 504 so that the tips of the interconnection elements 516 contact the contact pads 520 of the space transformer 506, optionally placing a spacer 544 atop the space transformer 506, placing the mounting ring 540 over the spacer 544, and inserting the screws 542 through the mounting ring 540 through the spacer 544 and into the holes 554 of the front mounting plate 534, and mounting this "subassembly" to the probe card 502 by inserting screws (one shown partially as 555) through the rear mounting plate 530 and through the probe card 502 into threaded holes (not shown) in the bottom (as viewed) surface of the front mounting plate 534. The actuator mounting plate 538 can then be assembled (e.g., with screws, on of which is shown partially as 556) to the rear mounting plate 530, pivot spheres 560 dropped into the holes 550 of the actuator mounting plate 532, and the differential screw elements 536 and 538 inserted into the holes 550 of the actuator mounting plate 532.

In this manner, a probe card assembly is provided having a plurality of resilient contact structures (524) extending therefrom for making contact with a plurality of bond pads (contact areas) on semiconductor dies, prior to their singulation from a semiconductor wafer, at a fine pitch which is commensurate with today's bond pad spacing. Generally, in use, the assembly 500 would be employed upside down from what is shown in the figure, with the semiconductor wafer being pushed (by external mechanisms, not shown) up onto the tips of the resilient contact structures (524).

As is evident from the figure, the front mounting plate (baseplate) 534 determined the position of the interposer 504 vis-a-vis the probe card 502. To ensure accurate positioning of the front mounting plate 534 vis-a-vis the probe card 502, a plurality of alignment features (omitted from the figure for illustrative clarity) such as pins extending from the front mounting plate) and holes extending into the probe card 502 may be provided.

It is within the scope of this invention that any suitable resilient contact structures (514, 516, 524) be employed on the interposer (504) and/or the space transformer (506), including tabs (ribbons) of phosphor bronze material or the like brazed or soldered to contact areas on the respective interposer or space transformer.

It is within the scope of this invention that the interposer (504) and the space transformer (506) can be pre-assembled with one another, such as with spring clips, described as element 486 of FIG. 29 of copending, commonly-owned PCT/US94/13373, extending from the interposer substrate.

It is within the scope of this invention that the interposer (504) be omitted, and in its stead, a plurality of resilient contact structures comparable to 514 be mounted directly to the contact pads (520) on the lower surface of the space transformer. However, achieving coplanarity between the probe card and the space transformer would be difficult. A principal function of the interposer is to provide compliance to ensure such coplanarity.

FIG. 2A illustrates, in perspective view, a suitable space transformer substrate 518 for the probe card assembly 500 of FIG. 2. As shown therein, the space transformer substrate 518 is suitably a rectangular solid, having a length "L" a width "W" and a thickness "T". In this figure, the top surface 518a of the space transformer substrate 518 is visible, to which the probing interconnection elements (compare 524) are mounted. As shown, a plurality (such as several hundred) of contact pads 522 are disposed on the top surface 518a of the space transformer substrate 518 in a given area thereof. The given area is indicated by the dashed lines labelled 570 and, as is evident, the contact pads 522 may be arranged in any suitable pattern within the given area 570.

As mentioned hereinabove, the space transformer substrate 518 is suitably formed as a multi-layer ceramic substrate, having alternating layers of ceramic and patterned conductive material.

The fabrication of such multi-layer ceramic substrates is well known and is employed, for example, in the manufacture of Land Grid Array (LGA) semiconductor packages. By appropriately routing the patterned conductive material within such a multi-layer substrate, it is simple and straightforward to dispose contact pads (not visible in this view, compare 520) on the bottom surface (not visible in this view) of the substrate 518 at a pitch which is different than (e.g., larger than) the pitch of the contact pads 522 on the top surface 518a of the substrate 518, and to connect the contact pads 520 with the contact pads 522 to one another internally within the substrate 518. Achieving a pitch of approximately 10 mils between the contact pads 522 on such a substrate is very feasible.

FIG. 2A illustrates a preferred feature of the space transformer substrate 518. As mentioned, the substrate 518 is a rectangular solid having a top surface 518a, a bottom surface (hidden from view in this figure), and four side edges 518b, 518c, 518d and 518e. As is shown, notches 572b, 572c, 572d and 572e are provided along the intersections of the respective side edges 518b, 518c, 518d and 518e and the top surface 518a of the substrate 518 along nearly the entire length (exclusive of the corners) of the respective side edges 518b . . . 518e. These notches 572b . . . 572e generally facilitate the manufacture of the space transformer substrate 518 as a multi-layer ceramic structure, and are also visible in the illustration of FIG. 2. It should be understood that the notches are not a necessity. Evidently, since the four corners of the substrate 518 are not notched (which is basically dictated by the process of making a ceramic, multilayer substrate), the mounting plate (540 of FIG. 2) must evidently accommodate these corner "features".

FIG. 2B illustrates an embodiment of a space transformer substrate 574 which is comparable to the space transformer substrate 518 of the previous illustration, and which can similarly be employed in the probe card assembly 500 of FIG. 2. In this case, a plurality (four of many shown) of areas 570a, 570b, 570c and 570d are defined, within each of which a plurality of contact pads 522a, 522b, 522c can readily be disposed in any desired pattern. It is generally intended that the spacing of the areas 570a . . . 570d correspond to the spacing of die sites on a semiconductor wafer so that a plurality of die sites can simultaneously be probed with a single "pass" of the probe card. (This is especially useful for probing multiple memory chips resident on a semiconductor wafer.) Typically, the pattern of the contact pads 522a . . . 522d within the respective areas 570a . . . 570d of the substrate 574 will be identical to one another, although this is not absolutely necessary.

The illustration of FIG. 2B clearly demonstrates that a single space transformer can be provided with probe elements for probing (making pressure contacts with) a plurality (e.g., four, as illustrated) of adjacent die sites on a semiconductor wafer. This is beneficial in reducing the number of setdowns (steps) required to probe all of the die sites on a wafer. For example, if there are one hundred die sites on a wafer, and four sets of probe elements on the space transformer, the wafer need only be positioned against the space transformer twenty-five times (ignoring, for purposes of this example, that efficiency at the edge (periphery) of the wafer would be somewhat attenuated). It is within the scope of this invention that the arrangement of probe sites (e.g., 570a . . . 570d), as well as the orientation of the individual probe elements (e.g., staggered) can be optimized to minimize the number of touchdowns required to probe an entire wafer. It is also within the scope of this invention that the probe elements can be arranged on the surface of the space transformer in a manner that alternate probe elements make contact with different ones of two adjacent die sites on the wafer. Given that it is generally desirable that the probe elements all have the same overall length, it is evident that the unconstrained manner in which the probe elements can be attached (mounted) directly to any point on the two-dimensional surface of the space transformer is superior to any technique which constrains the location whereat the probe elements are attached to a probe card (e.g., ring arrangements, as described hereinabove). It is also within the scope of this invention that a plurality of non-adjacent die sites on a wafer could be probed in this manner. The present invention is particularly beneficial to probing unsingulated memory devices on a wafer, and is useful for probing die sites having any aspect ratio.

Tiling the Space Transformer

Figure 3:
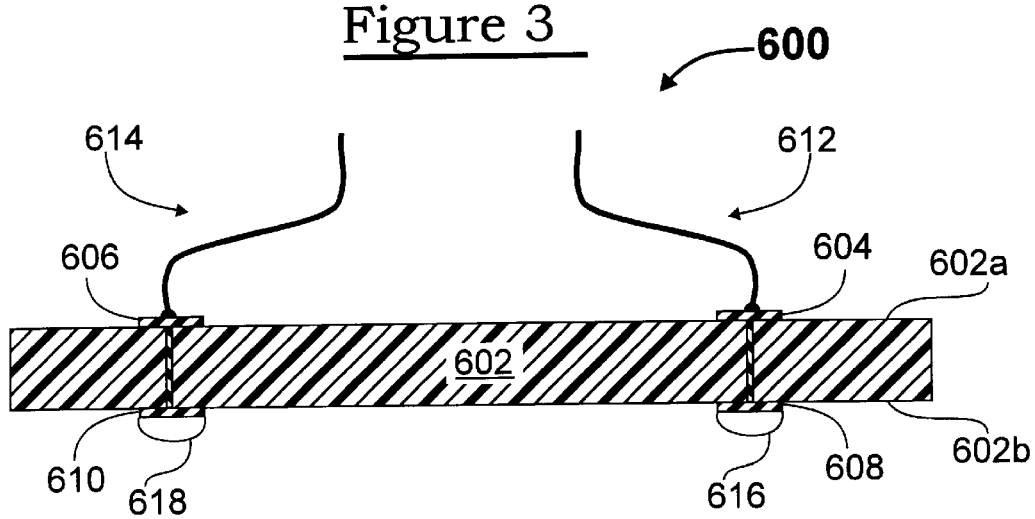
FIG. 3 is a cross-sectional view of an embodiment of a tile component, according to the invention.

FIG. 3 (comparable to FIG. 6 of commonly-owned, copending PCT/US96/08117) illustrates an embodiment of a tile 600 having a substrate 602 formed of an insulating material such as ceramic, terminals (two of many shown) 604 and 606 disposed on (or within) a top (as viewed) surface 602a thereof, and terminals (two of many shown) 608 and 610 disposed on an opposite, bottom surface 602b thereof. The tile substrate 602 is similar to the space transformer substrate 402 of FIG. 1. Selected ones of the terminals 604 and 606 are electrically-connected to corresponding selected ones of the terminals 608 and 610, respectively, in any suitable manner, such as with conductive vias (not shown) extending through the substrate 602. (Vias through and internal wiring within a substrate are well known and are shown, for example, in FIG. 1.) A plurality (two of many shown) of spring elements 612 and 614 are mounted to the terminals 604 and 606, respectively, and may be composite interconnection elements such as have been described hereinabove, or monolithic spring elements such as have been described hereinabove.

As used herein, the term "spring contact carrier" means a tile substrate (e.g., 602) having spring contacts (e.g., 612, 614) mounted to one surface thereof.

In FIG. 3, the spring elements 612 and 614 are illustrated to have the same configuration as the probe elements 524 shown in FIG. 2. This is merely illustrative, and it should be understood that any spring elements having any configuration (shape) can be affixed to the surface 602a of the tile substrate 602.

As mentioned hereinabove, such a tile substrate having spring elements affixed thereto is readily mounted and connected to a space transformer component (e.g., 506) of a probe card assembly (e.g., 500). As illustrated, solder bumps 616 and 618 are readily formed on the terminals 608 and 610, respectively, so that the tile 600 can be connected to corresponding pads (terminals) of a space transformer component by reflow heating, forming solder joints between the terminals of the tile component and the terminals of the space transformer component. Alternatively, a z-axis conductive adhesive (not shown) can be used, in lieu of solder, to effect electrical connections between the terminals of the tile component and the terminals of the space transformer component.

Figure 3A:
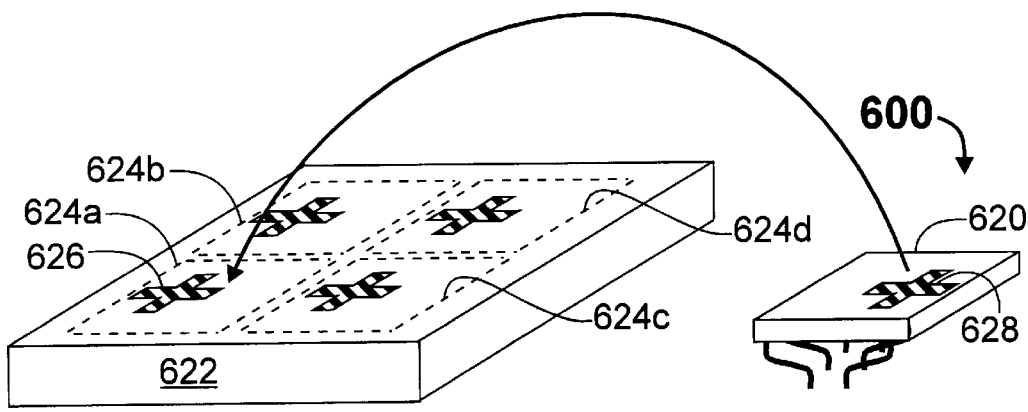
FIG. 3A is a perspective, exploded view of a technique for mounting a plurality of tile components to a space transformer component (larger substrate), according to the invention.

FIG. 3A illustrates the manner in which a plurality (one of many shown) of tiles 620 (comparable to the tile 600 of FIG. 3) can be mounted to the surface of a space transformer component 622 (comparable to the space transformer component substrate 574 illustrated in FIG. 2B).

The top (visible) surface of the space transformer component has a plurality (four of many shown) of areas 624a, 624b, 624c and 624d (comparable to 570a, 570b, 570c and 570d), within each of which a plurality of contact pads (not shown, compare 522a, 522b, 522c, 522d) are disposed in any desired pattern.

In FIG. 3A, the solder bumps (e.g.) on the surface of the tile substrate opposite the spring elements are omitted, for illustrative clarity. When reflow heated to solder the tile substrate to the space transformer substrate, the tiles 620 will tend to self-align to the areas 624a . . . 624d of the space transformer 622. However, small solder features (such as C4 bumps) may not always a sufficient amount of surface tension force to effect such self-alignment.

According to an aspect of the invention, in order to enhance self-alignment of each tile 620 to each area 624a . . . 624d), the top (visible in the figure) surface of the space transformer substrate 622 is provided with at least one solderable feature 626 and the mating bottom (visible in the figure) surface of the tile substrate 620 is provided with corresponding at least one solderable feature 628. During reflow heating, solder disposed upon and wetting these two corresponding mating features 626 and 628 will provide enhanced momentum for effecting self-alignment of the tile substrate to the space transformer substrate. The solder may be applied to either one of the mating features prior to reflow heating.

FIG. 3A illustrates a significant feature of the present invention—namely, that a plurality of tiles can be mounted to a single space transformer component of a probe card assembly to effect multi-head testing of multiple die sites on a semiconductor wafer in a single pass (touchdown), including wafer-scale testing. A space transformer substrate having a plurality of tiles attached thereto functions readily as a multiple device test head.

It is within the scope of this invention that the spring elements may extend beyond the periphery of the tile substrate, both in this embodiment and in the embodiment of tiling semiconductor wafers described hereinbelow.

Making Discrete Power Connections to the Space Transformer

In the probe card assembly described hereinabove, the interposer component (504) conveys both signals and power (i.e., power and ground) to terminals (520) on the back side of the space transformer component (506).

According to the present invention, only signals (e.g., digital signals) are provided to the space transformer component via the interposer component. Power (i.e., power and ground) is provided to the space transformer component via edge connections to external means such as a flexible printed circuit board.

FIG. 4 illustrates a space transformer component 700 similar (but not identical) to the space transformer component 400 of FIG. 1. The space transformer substrate 702 (compare 402) has a top (as viewed) surface 702a and a bottom (as viewed) surface 702b, and is formed as a multi-layer component having alternating layers of insulating material (e.g., ceramic) and conductive material. In this example, one wiring layer is shown as including two (of many) conductive traces 704a and 704b (compare 404a and 404b). A plurality (two of many shown) of terminals 706a and 706b (compare 406a and 406b) are disposed on the top surface 702a of the space transformer substrate 702 at a relatively fine pitch (relatively close to one another).

A plurality (one of many shown) of terminals 708b (compare 408a and 408b) are disposed on the bottom surface 702b of the space transformer substrate 702 at a relatively coarse pitch (relative to the terminals 706a and 706b, further apart from one another). For example, the bottom terminals 708b may be disposed at a 50–100 mil pitch (comparable to printed circuit board pitch constraints), and the top terminals 706a and 706b may be disposed as a 5–10 mil pitch (comparable to the center-to-center spacing of semiconductor die bond pads), resulting in a 10:1 pitch-transformation.

Selected ones of the top terminals, such as those represented by the terminal 706b, are connected to corresponding ones of the bottom terminals 708b by associated conductors 710b and 712b, connecting the terminals to the conductive traces 704b.

Other selected ones of the top terminals, such as those represented by the terminal 706a, are connected to associated conductive traces 704a via associated conductors 710a. These conductive traces 704a extend to the edge of the space transformer substrate and are exposed for making external connections thereto. These exposed areas are labelled 750 in the figure.

Figure 4A:
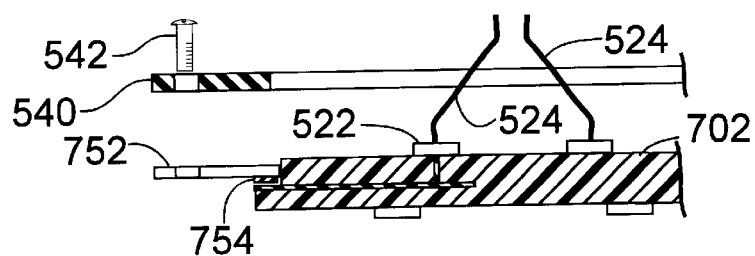
FIG. 4A is a cross-sectional view of the space transformer component of FIG. 4, shown as part of an overall probe card assembly, according to the invention.

FIG. 4A illustrates making external connections to the exposed areas 750 of the conductive traces 704a with suitable means such as a flexible circuit board 752 having a plurality of contact areas 754 corresponding to the plurality of exposed areas 750. In this manner, power and ground can be provided to the space transformer substrate 702 and, in turn, provided to selected ones of the spring contacts 724 (compare 524 in FIG. 2) extending from the surface of the space transformer substrate (compare 506 in FIG. 2).

The space transformer 700 of the present invention is suitably assembled into a probe card assembly using similar components 540, 542, etc. (compare FIG. 2).

Figure 4B:
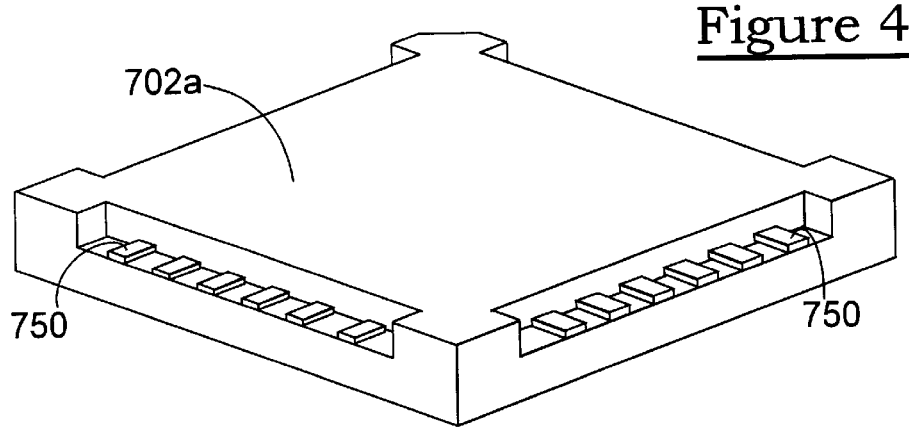
FIG. 4B is a perspective view of the space transformer component of FIG. 4, according to the invention.

FIG. 4B is a perspective view of the space transformer component 700 of FIG. 4. In this figure, it can be seen that the exposed areas 750 of the traces 704a "sit" on a shelf which is formed in the body of the space transformer substrate. In this figure, the terminals 706a and 706b are omitted from the visible top surface 702a of the space transformer substrate, for illustrative clarity. It is within the scope of this invention that a plurality of sets of terminals 706a/706b can populate the top surface 702a in the manner presented in FIGS. 2A and 2B.

Figure 5A:
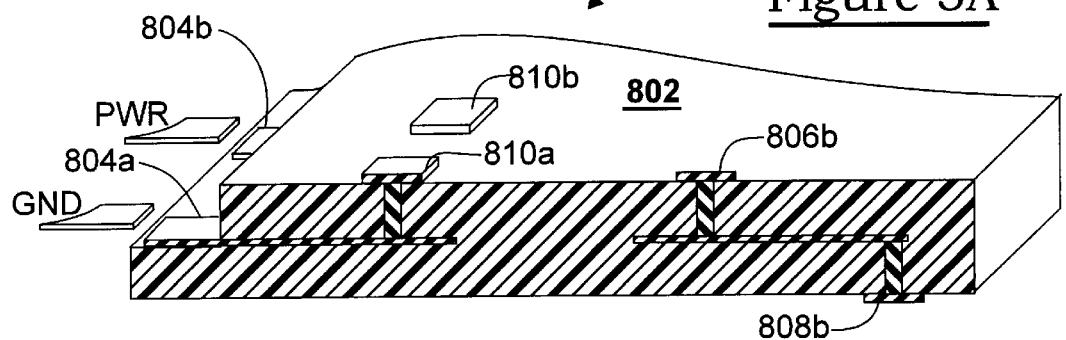
FIG. 5A is a perspective view of a space transformer component with side-by-side edge connections, according to an embodiment of the invention.

FIG. 5A illustrates an embodiment 800 wherein a space transformer substrate 802 (compare 702, FIG. 7) is provided with edge connections which are discrete from its bottom connections, as discussed hereinabove. This figure illustrates how exemplary ground (GND) and power (PWR) connections can be made in a side-by-side manner to corresponding exposed portions of traces 804a (compare 704a) and 804b, respectively, such as by a flexible circuit board (not shown). These ground and power signals are conveyed from the edge of the space transformer substrate, through the space transformer substrate, to the terminals 810a (compare 706a) and 810b on the top surface of the substrate. The spring elements (524) are omitted from this view, for illustrative clarity. Other (e.g., signal) connections are made directly through the space transformer substrate in a conventional manner (i.e., from terminal 808b to terminal 806b).

Figure 5B:
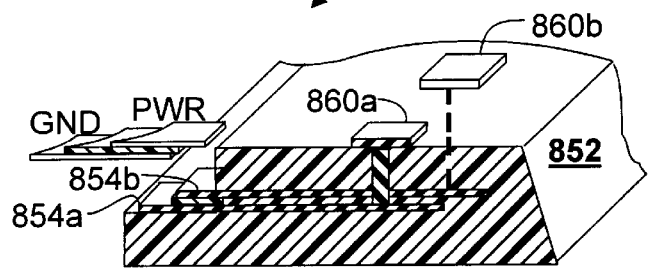
FIG. 5B is a perspective view of a space transformer component with stacked edge connections, according to an embodiment of the invention.

FIG. 5B illustrates an embodiment 850 wherein a space transformer substrate 852 (compare 802) is provided with edge connections which are discrete from its bottom connections, as discussed hereinabove. This figure illustrates how exemplary ground (GND) and power (PWR) connections can be made in a stacked manner to corresponding exposed portions of traces 854a (compare 804a) and 854b (compare 804b), respectively, such as by a flexible circuit board (not shown). These ground and power signals are conveyed from the edge of the space transformer substrate, through the space transformer substrate, to the terminals 860a (compare 810a) and 860b (compare 810b) on the top surface of the substrate. The spring elements (524) are omitted from this view, for illustrative clarity. Other (e.g., signal) connections are made directly through the space transformer substrate in a conventional manner (not shown, compare right-hand portion of FIG. 5A).

Although the invention has been illustrated and described in detail in the drawings and foregoing description, the same is to be considered as illustrative and not restrictive in character—it being understood that only preferred embodiments have been shown and described, and that all changes and modifications that come within the spirit of the invention are desired to be protected. Undoubtedly, many other "variations" on the "themes" set forth hereinabove will occur to one having ordinary skill in the art to which the present invention most nearly pertains, and such variations are intended to be within the scope of the invention, as disclosed herein.

What is claimed is:

1. A space transformer for a probe card assembly, comprising:

a space transformer having a first surface, a second surface, and a side edge, the side edge distinct from the first surface and distinct from the second surface;

a first plurality of terminals disposed on the first surface of the space transformer;

a second plurality of terminals disposed on the second surface of the space transformer and connected within the space transformer to a first portion of the first plurality of terminals; and a third plurality of terminals disposed along the side edge of the space transformer and connected within the space transformer to a second portion of the first plurality of terminals and not connected to the second plurality of terminals, and with no corresponding connection to the first portion of the first plurality of terminals.

2. A probe card assembly, comprising:

a probe card having a top surface, a bottom surface and a plurality of contact terminals on the top surface thereof;

an interposer having a top surface, a bottom surface, a first plurality of resilient contact structures extending from the bottom surface thereof and a second plurality of contact structures extending from the top surface thereof; and a space transformer having a first surface, a second surface, and a side edge, the side edge distinct from the first surface and distinct from the second surface;

a first plurality of terminals disposed on the first surface of the space transformer;

a second plurality of terminals disposed on the second surface of the space transformer and connected within the space transformer to a first portion of the first plurality of terminals; and a third plurality of terminals disposed along the side edge of the space transformer and connected within the space transformer to a second portion of the first plurality of terminals and not connected to the second plurality of terminals, and with no corresponding connection to the first portion of the first plurality of terminals;

wherein:

the first plurality of resilient contact structures effect a pressure connection with the contact terminals of the probe card; and the second plurality of resilient contact structures effect a pressure connection with the second plurality of terminals on the bottom surface of the space transformer.

3. A space transformer for a probe card assembly, comprising:

a space transformer having a first surface, a second surface, and a side edge, the side edge distinct from the first surface and distinct from the second surface;

a first plurality of terminals disposed on the first surface of the space transformer;

a plurality of resilient contact elements connected to selected ones of the first plurality of terminals disposed on the first surface;

a second plurality of terminals disposed on the second surface of the space transformer and connected within the space transformer to a first portion of the first plurality of terminals; and a third plurality of terminals disposed along the side edge of the space transformer and connected within the space transformer to a second portion of the first plurality of terminals and not connected to the second plurality of terminals.

* * * * *